United States Patent [19]
Vrablec

[11] Patent Number: 5,296,818
[45] Date of Patent: Mar. 22, 1994

[54] ELECTRICAL YOKE TESTER

[75] Inventor: John W. Vrablec, Sealy, Tex.

[73] Assignee: Houston Industries Incorporated, Houston, Tex.

[21] Appl. No.: 929,690

[22] Filed: Aug. 13, 1992

[51] Int. Cl.$^5$ .............................................. G01R 31/02
[52] U.S. Cl. ..................................... 324/542; 324/556; 340/653
[58] Field of Search ............... 324/73.1, 133, 149, 324/542, 556, 555, 508, 537; 340/644, 653

[56] References Cited

U.S. PATENT DOCUMENTS

| | | | |
|---|---|---|---|
| 1,765,396 | 6/1930 | Betts | 340/653 |
| 2,810,881 | 10/1957 | Daily | 324/73.1 |
| 2,848,681 | 8/1958 | McKeige | 324/418 |
| 2,964,701 | 12/1960 | Argabright | 324/542 |
| 3,201,773 | 8/1965 | Magee | 340/653 |
| 3,217,244 | 11/1965 | Glover | 324/539 |
| 3,623,047 | 11/1971 | Stallebrass | 340/644 |
| 3,778,801 | 12/1973 | Nudelmont | 324/542 |
| 4,164,701 | 8/1979 | Gulledge et al. | 324/508 |
| 4,254,374 | 3/1981 | Trihus | 324/539 |
| 4,318,031 | 3/1982 | Lonseth et al. | 340/653 |
| 4,777,479 | 10/1988 | Hinckley | 340/644 |
| 4,797,623 | 1/1989 | Hoffman et al. | 324/556 |
| 4,922,185 | 5/1990 | Davidson et al. | 324/542 |
| 4,929,902 | 5/1990 | Nelson, III | 324/542 |
| 4,929,932 | 5/1990 | Shipkowski | 340/644 |

FOREIGN PATENT DOCUMENTS 2254156A 3/1991 United Kingdom ............... 324/556

Primary Examiner—Kenneth A. Wieder
Assistant Examiner—Christopher M. Tobin
Attorney, Agent, or Firm—Pravel, Hewitt, Kimball & Krieger

[57] ABSTRACT

A tester is provided for a control yoke of an oil-filled electrical power switch. The tester can be easily and safely used by a line crew member. The tester is connected to the yoke which carries electrical signals to control the position of the switch. Control signals are then furnished to the yoke in the usual manner. Indicators on the tester identify whether the yoke or the switch is the source of the problem.

11 Claims, 1 Drawing Sheet

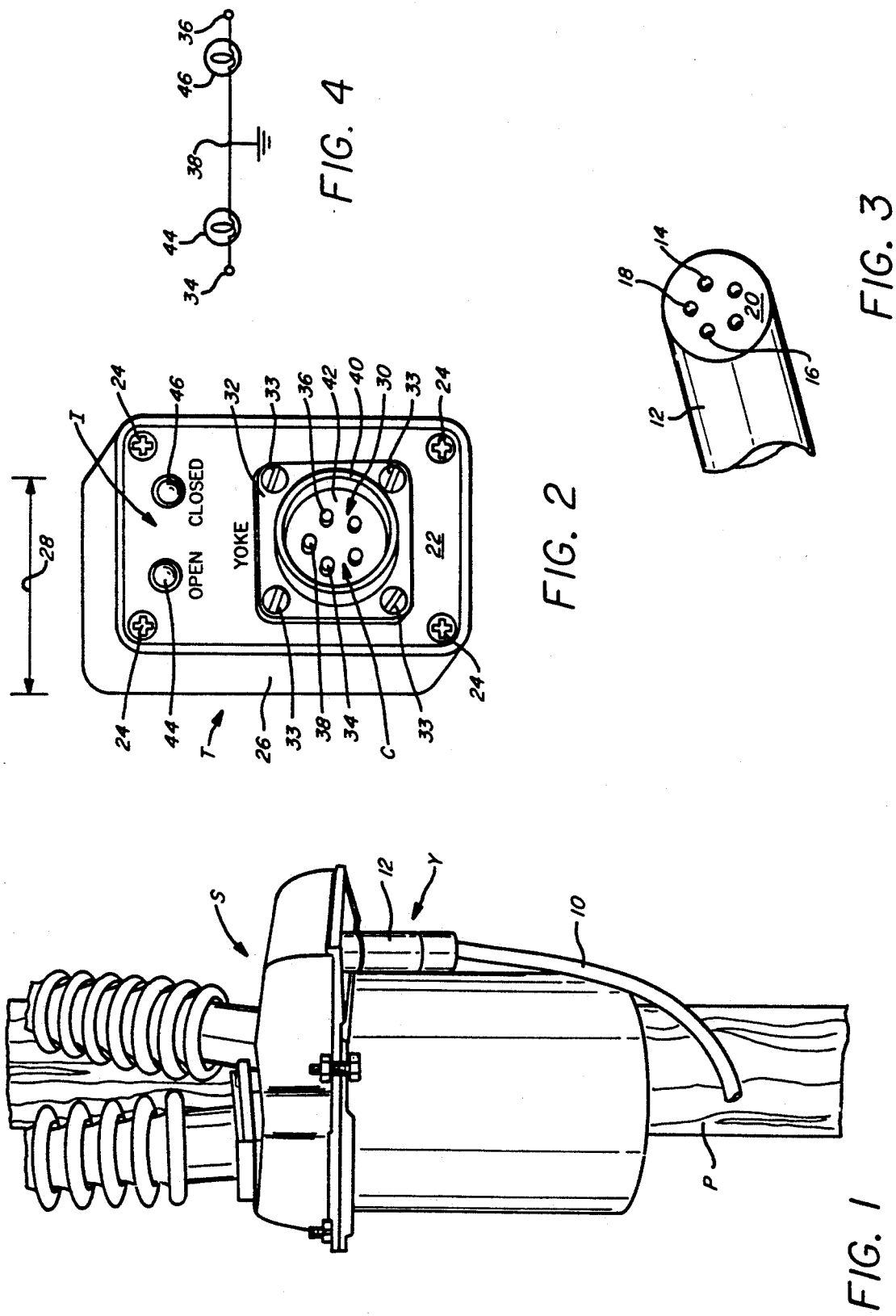

ELECTRICAL YOKE TESTER

BACKGROUND OF THE INVENTION

1. FIELD OF THE INVENTION

The present invention relates to test equipment for yokes for electrical power switches.

2. DESCRIPTION OF PRIOR ART

In electrical power distribution, oil-filled switches have been widely used on power distribution lines. The position of the switch has been controlled by signals furnished to the switch from an associated control yoke.

From time to time, a switch became inoperative, in that it would not change position in response to control signals to the yoke. A fault was then known to be present, but it was not possible to identify the yoke or the switch as the source of the problem. In order to isolate and identify the source of the fault, a line crew member typically in an elevated line basket had to disconnect the yoke from the oil switch. Volt-meter probes could then be brought into contact with the yoke and the switch in an attempt to isolate the fault. This was a cumbersome and inconvenient procedure.

SUMMARY OF THE INVENTION

Briefly, the present invention provides a new and improved tester for yokes for electrical switches in an electrical power distribution system. The tester is an apparatus for testing the transfer of control signals from the yoke to the electrical switch. The tester includes connectors which are adapted to be interfitted into electrical contact with the yoke. Indicators which are electrically connected to the connectors are provided to indicate the flow of electrical current through the yoke. The connectors and the indicators are provided in a housing which can be easily and firmly held in a service crew member's hand. This permits the service crew member to insure firm electrical contact between the tester and the yoke during testing. The apparatus of the present invention is also for isolating the source of a fault in the transfer of control signals between the yoke and the electrical switch of the power distribution system.

BRIEF DESCRIPTION OF THE DRAWINGS

FIG. 1 is an isometric view of a pole-mounted switch and yoke in an electrical power distribution system.

FIG. 2 is an isometric view of an apparatus according to the present invention.

FIG. 3 is an isometric view of a portion of the yoke of FIG. 1.

FIG. 4 is a schematic electrical circuit diagram of the apparatus of FIG. 2.

DESCRIPTION OF PREFERRED EMBODIMENT

In the drawings, the letter T designates generally an electrical yoke tester apparatus according to the present invention. The tester T is adapted to test a yoke Y which transfers control signals to change the position of an oil-filled electrical switch S mounted on a pole P in an electrical power distribution system. The switch S is of the conventional type, adapted to either allow or block the flow of electrical power in the power distribution system, depending upon its position.

The position of the switch S is set by control signals transferred through a control cable 10 and the yoke Y to conventional switch relay coils within the switch S. For example, the cable 10 has a conductor for an "open" or "trip" signal to pass through the yoke Y to the switch S to open the switch. The control cable 10 also has a conductor for a "close" signal to pass through the yoke Y to cause the switch S to move to a closed position. The control cable 10 also includes a ground conductor for electrical ground and safety purposes as well.

At times during service use, the switch S may fail to operate in response to a control signal. Specifically, the switch S fails to change position in response to control signals sent over the control cable 10. It is then known that a fault is present. However, it is not possible without further testing to isolate the source of the fault in the transfer of the control signals through the yoke Y to the switch S. Specifically, one cannot without more identify the yoke Y or the switch S as the source of the problem. As will be set forth in detail below, a line crew member with the tester T can readily isolate and identify whether it is the yoke Y or the switch S that is the source of the problem preventing transfer of control signals.

The yoke Y includes a generally cylindrical grip body 12 and a number of connector sockets, one for each conductor in the control cable 10. The connector sockets thus include at least a socket 14 connected to a conductor in the cable 10 for an "open" or "trip" signal, a socket 16 connected to a conductor for a "close" signal and a socket 18 connected to the ground conductor in the control cable 10.

The connector sockets extend rearwardly from a generally flat or flush surface 20 at an end of the grip body 12 of the yoke Y opposite the connection to the control cable 10. The connector sockets in the yoke Y are adapted to fit onto corresponding connector probes of the switch S and transfer control signals from the yoke Y to the switch S.

Considering the tester T more in detail, a connector group C of electrical connectors is mounted along with indicators I in a container housing H. The connectors C are provided for engaging in contact with the electrical conductors of the yoke Y through its connector sockets. The connectors C are mounted with the housing H as are the indicators I. The indicators I are electrically connected to the connectors C to indicate the flow of electrical current to the yoke Y.

The housing H is a generally rectangular box-shaped member having a front face 22 mounted by screws 24 on a container 26 for other components of the tester T. The housing H typically has a width, as indicated by an arrow 28, of approximately three or four inches and a height of slightly larger dimension, approximately four or five inches. It should be understood that the particular dimensions given are by way of example and that other sizes might also be used. Preferably, the width of the housing H is of a size such that it permits the tester T to fit firmly within the hand of a service crew member and be firmly gripped during use of the tester T.

The connectors C are electrical connector probes 30 extending outwardly from a mounting plate 32 on the face 22 of the housing H. The mounting plate 32 is attached to the face 22 of the housing H by suitable screws or fasteners 33. The connector probes include a connector probe 34 to be fitted into the socket 14 for the "open" or "trip" signal, a connector probe 36 to be fitted into the socket 16 for the close signal, and a connector probe 38 to be fitted into the socket 18 for the ground conductor. Other connector probes are typically provided to be equal in number to the number of sockets provided in the yoke Y.

A protective rim 40 is formed on the mounting plate 32 about the connector probes 30. The rim 40 also serves as an insertion guide for the grip body 12 of the yoke Y. A surface 42 of the mounting plate 32 within the mounting rim 40 is adapted to mount flush with the face 20 of the yoke Y when the connectors C are fully inserted into the connector sockets of the yoke Y. Because of the cylindrical gripping body 12 of the yoke Y and the size of the housing H, a service or line crew member can by use of hand grip strength easily bring the yoke Y into firm engagement with the tester T, even while in an elevated service basket near the pole P. This avoids cumbersome testing manipulations using voltmeter probes as was required in the prior art.

The indicator I includes an "open" or "trip" indicator 44 electrically connected between the connector probe 34 and the electrical ground 18. The indicators I further include a "close" indicator 46 electrically connected between the connector probe 36 and the electrical ground 18. The indicators 44 and 46 are mounted on the face 22 of the housing H adjacent to and preferably above the connectors C.

In the preferred embodiment, the open or trip indicator 44 is a neon indicator lamp emitting green light, while the close indicator 46 is a neon indicator lamp emitting red light. It should be understood, however, that other types or colors of lamps or light emitters, such as light emitting diodes, or the like, or even other types of indicators then lights could be used, if desired.

In the operation of the present invention, upon indication that the oil switch S is not properly operating, a line crew member disconnects the yoke Y from the switch S. The yoke Y is then moved so that the connector sockets therein are aligned with the appropriate ones of the connector probes of the connectors C on the tester T.

The yoke Y and tester T are then brought together until the face 20 of the yoke Y is firmly in contact with the surface 42 within the mounting rim 40 of the yoke Y. As has been set forth, this can be readily done by the crew member. The connectors C are then firmly in electrical contact with the sockets in the yoke Y.

At this time, depending upon the control position set for the switch S, one of either the green indicator lamp 44 (indicating voltage in the "open" control circuit) or the red indicator lamp 46 (indicating voltage in the "close" control circuit) should emit light. In the event that neither of lights 44 or 46 emits light, it is known that the fault in the control system is isolated within the yoke Y or control cable 12 and these connectors can then be replaced.

Should one of the indicator lamps 44 or 46 emit light at this time, it is then known that the circuit from cable 12 through yoke Y to the indicated portion of the switch S is operative. The control for the position of switch S can then be changed to the opposite position. At this time, the other of the indicator lamps I should emit light to show the presence of voltage in that portion of the cable 12 and the yoke Y.

If that indicator lamp fails to emit light, then it is known that the faulty condition is again in the yoke Y, and more specifically in that most recently tested portion of the yoke Y.

Should both lamps emit light in the foregoing test procedure in response to the presence of control signals to the yoke, then the faulty condition is in the switch S.

It can thus be seen that the tester T according to the present invention has made it safer and easier and a considerably quicker process to isolate the fault in transfer of control signals between the yoke Y and the switch S.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

I claim:

1. An apparatus for isolating the source of a fault in transfer of control signals between a yoke and an electrical switch in an electrical power distribution system, the yoke having an open signal conductor for an open control signal to open the electrical switch and a close signal conductor for a close control signal to close the electrical switch, comprising:
    connector means comprising a receptacle with appropriately spaced connectors for enabling a slidable, mating fit connection to the signal conductors of the yoke without disassembly of said yoke, said connector means further comprising:
    a connector electrically connected to the open signal conductor; and
    a connector electrically connected to the close signal conductor;
    indicator means electrically connected to said connector means for indicating the flow of electrical current through the yoke, said indicator means comprising:
    an open indicator for indicating on passage of the open control signal through the open signal conductor that such conductor is operative and on failing to indicate such passage identifying a faulty open signal conductor;
    a close indicator for indicating on passage of the close control signal through the close signal conductor that such conductor is operative and on failing to indicate such passage identifying a faulty close signal conductor;
    said open indicator and said close indicator on both indicating passage of their respective signals isolating the faulty condition as being in the electrical switch; and
    housing means for containing said connector means and said indicator means.

2. The apparatus of claim 1, wherein the yoke has conductors for signals to control the position of the electrical switch and sockets connected to said conductors, and wherein:
    said connector means comprises connector probes for fitting into the sockets of the yoke.

3. The apparatus of claim 2, wherein:
    said connector probes are mounted on a face of said housing means extending outwardly therefrom.

4. The apparatus of claim 3, further including:
    a protective rim mounted on the face of said housing means about said connector probes.

5. The apparatus of claim 1, wherein the yoke has conductors for signals to control the position of the electrical switch and individual sockets, each connected to one of said conductors, and wherein:

said connector means comprises connector probes, one for fitting into a corresponding one of the sockets of the yoke.

6. The apparatus of claim 5, wherein:
said connector probes extend into the sockets of the yoke when fitted therewith, permitting the yoke to engage and contact said housing means.

7. The apparatus of claim 5, wherein:
said indicator means are mounted on a face of said housing means; and
said connector probes are mounted adjacent said indicator means on said face of said housing means extending outwardly therefrom.

8. The apparatus of claim 7, further including:
a protective rim mounted on the face of said housing means about said connector probes.

9. The apparatus of claim 1, wherein:
said open indicator and said close indicator are light emitting means.

10. The apparatus of claim 9, wherein:
said open indicator and said close indicator give different color indications from each other.

11. The apparatus of claim 1, wherein:
said housing means comprises a box member having a width dimension suitable for fitting within the hand of a service crew member.

* * * * *